(12) United States Patent
Duggal

(10) Patent No.: US 8,525,574 B1
(45) Date of Patent: Sep. 3, 2013

(54) BOOTSTRAP SWITCH CIRCUIT WITH OVER-VOLTAGE PREVENTION

(75) Inventor: Abhishek Duggal, Emmaus, PA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/471,659

(22) Filed: May 15, 2012

(51) Int. Cl.
*H03K 17/16* (2006.01)

(52) U.S. Cl.
USPC .............................. 327/390; 327/94; 327/589

(58) Field of Classification Search
USPC ........................................ 327/91–96, 390, 589
See application file for complete search history.

(56) References Cited

U.S. PATENT DOCUMENTS

| 5,500,612 | A * | 3/1996 | Sauer | 327/91 |
|---|---|---|---|---|
| 6,249,154 | B1 * | 6/2001 | Jouffre et al. | 327/91 |
| 6,724,236 | B1 * | 4/2004 | Sarraj | 327/390 |
| 6,956,411 | B1 * | 10/2005 | Holloway | 327/94 |
| 7,183,814 | B2 * | 2/2007 | Kudo | 327/91 |
| 7,274,222 | B2 * | 9/2007 | Alacoque et al. | 327/94 |
| 7,276,962 | B1 * | 10/2007 | Tomasi | 330/9 |
| 7,397,284 | B1 * | 7/2008 | Liu | 326/88 |
| 7,723,962 | B2 * | 5/2010 | Parkes et al. | 322/28 |
| 8,248,282 | B2 * | 8/2012 | Payne et al. | 341/123 |
| 2006/0049857 | A1 * | 3/2006 | Song | 327/94 |
| 2012/0274362 | A1 * | 11/2012 | Doris et al. | 327/94 |

* cited by examiner

*Primary Examiner* — Thomas J Hiltunen
(74) *Attorney, Agent, or Firm* — Mendelsohn, Drucker & Dunleavy, P.C.; Steve Mendelsohn

(57) ABSTRACT

In one embodiment, a bootstrap switch circuit has (i) a switch device that selectively provides a input signal as an output signal and bootstrap circuitry that provides a relatively high-voltage control signal to the gate of the switch device to turn on the switch device while preventing any over-voltage conditions from being applied to the switch device. The bootstrap circuitry includes a capacitor and a number of transistors configured as either switches or inverters. The circuit has two operating phases: one in which the capacitor gets charged while the switch device is turned off and the other in which the charged capacitor is isolated and used to generate the high-voltage control signal to be a fixed voltage difference above the current voltage level of the input signal applied to the switch device, thereby preventing an over-voltage condition.

22 Claims, 4 Drawing Sheets

300

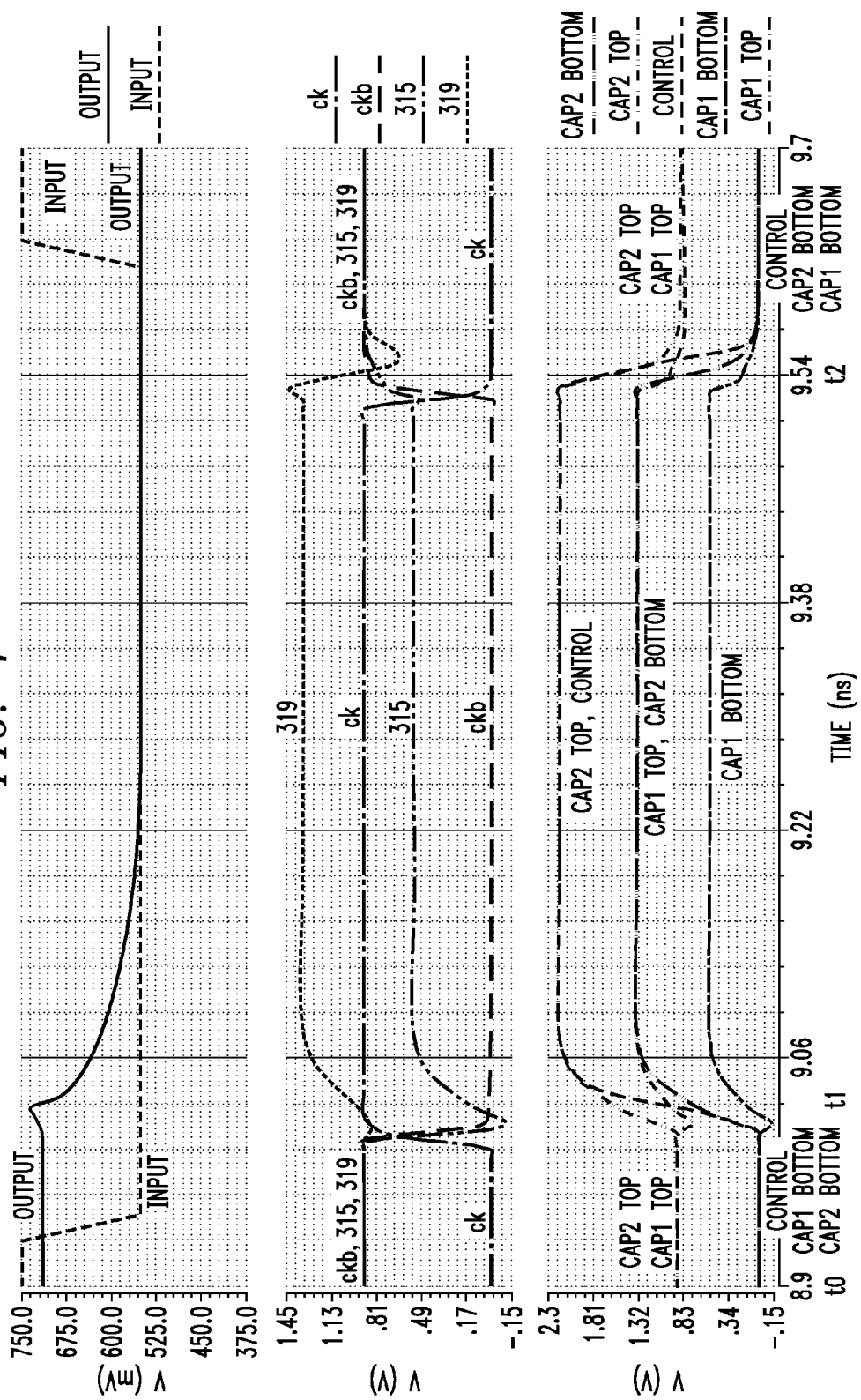

US 8,525,574 B1

BOOTSTRAP SWITCH CIRCUIT WITH OVER-VOLTAGE PREVENTION

BACKGROUND

This section introduces aspects that may help facilitate a better understanding of the invention. Accordingly, the statements of this section are to be read in this light and are not to be understood as admissions about what is prior art or what is not prior art.

Switches are a common design feature in electronic systems. Typically, a switch is a three-terminal device having control, input, and output terminals. Depending on the control voltage, a switch is either in the ON state or in the OFF state. Ideally, when in the ON state, the switch presents a vanishingly low resistance across its input and output terminals and, when in the OFF state, the switch does not allow any leakage current to flow through it. A typical switch may be implemented using a MOSFET transistor, where a control voltage is applied to the transistor's gate to control whether an input signal applied to one channel terminal (i.e., source or drain) of the transistor is presented as an output signal at the transistor's other channel terminal. Speed and linearity performance of a switch are improved by applying the highest possible control voltage and by applying a MOSFET gate-to-source voltage that is independent of the voltage of the input signal applied to the switch. On the other hand, if the gate-to-channel voltages applied to a transistor-based switch are too high, then the transistor devices are susceptible to degradation and even failure over their operating lifetimes, especially for modern semi-conductor technologies that involve very small thin-oxide gate thicknesses.

Some switches are implemented with bootstrap circuitry that allows the control voltage applied to a switch to be greater than the power supply voltage. To avoid over-voltage conditions, the bootstrap circuitry needs a mechanism to limit not only the gate-to-channel voltage applied to the transistor used to implement the switch, but also the voltages across any pair of terminals of any transistor device that constitute the entire bootstrap circuitry. Unfortunately, conventional bootstrap circuitry is relatively complex, consuming significant layout area and involving relatively long design development time. A. M. Abo, "Design for reliability of low-voltage, switched-capacitor circuits," Ph.D. dissertation, Univ. California, Berkeley, Calif., 1999 ("the Abo reference"), incorporated herein by reference in its entirety, shows, in FIG. 5.5, one example of a conventional bootstrap switch circuit having bootstrap circuitry requiring eleven transistors, one inverter (presumably implemented using another two transistors), and three capacitors.

SUMMARY

In one embodiment, the present invention is an apparatus having a bootstrap switch circuit comprising a switch device, a first capacitor, and bootstrap circuitry. The switch device is connected between an input node and an output node, and the first capacitor is connected between the input node and a gate of the switch device. The bootstrap circuitry selectively interconnects a first plate of the first capacitor to the gate of the switch device and a second plate of the first capacitor to the input node. During a first phase, the bootstrap circuitry is configured to (i) turn off the switch device and (ii) charge the first capacitor to a pre-charge voltage level which is no higher than a supply voltage level. During a second phase, the bootstrap circuitry is configured to (i) cease charging the first capacitor and (ii) connect the first capacitor between the input node and the gate of the switch device, such that a voltage difference between the gate and a channel node of the switch device is maintained at or below a voltage tolerance level for the switch device. The bootstrap circuitry has no more than two capacitors.

In another embodiment, the present invention is an apparatus having a bootstrap switch circuit comprising a thick-oxide switch device, a first capacitor, and bootstrap circuitry. The thick-oxide switch device is connected between an input node and an output node. The first capacitor is connected between the input node and a gate of the switch device. The bootstrap circuitry selectively interconnects a first plate of the first capacitor to the gate of the switch device and a second plate of the first capacitor to the input node. During a first phase, the bootstrap circuitry is configured to (i) turn off the switch device and (ii) charge the first capacitor to a pre-charge voltage level which is no higher than a supply voltage level. During a second phase, the bootstrap circuitry is configured to (i) cease charging the first capacitor and (ii) connect the first capacitor between the input node and the gate of the switch device, such that a voltage difference between the gate and a channel node of the switch device is maintained at or below a voltage tolerance level for the switch device. The bootstrap circuitry comprises one or more thin-oxide devices having gate oxide thinner than gate oxide of the thick-oxide switch device.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 4 shows a timing diagram of some of the signals in the bootstrap switch circuit of FIG. 3.

DETAILED DESCRIPTION

Figure 1:
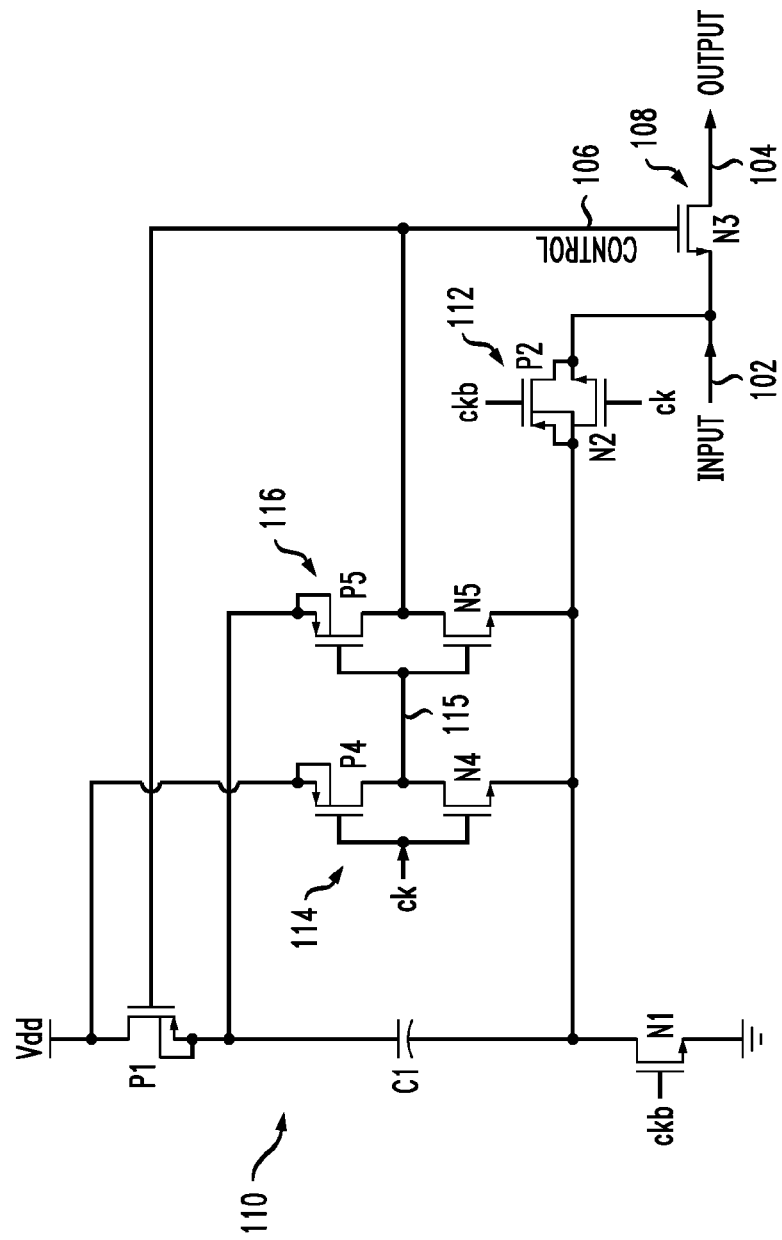
FIG. 1 shows a schematic circuit diagram of a bootstrap switch circuit according to one embodiment of the disclosure.

FIG. 1 shows a schematic circuit diagram of a bootstrap switch circuit 100 according to one embodiment of the disclosure. Switch circuit 100 receives an input signal 102 and conditionally provides that input signal as an output signal 104 depending on the voltage of a control signal 106 applied to a switch 108 implemented using an n-type (e.g., nMOSFET) transistor N3. The input signal 102 may be any analog voltage between the Vdd and ground supply voltages.

In addition, switch circuit 100 comprises bootstrap circuitry 110 which (i) consists of p-type (e.g., pMOSFET) transistors P1, P2, P4, and P5, n-type (e.g., nMOSFET) transistors N1, N2, N4, and N5, and capacitor C1 and (ii) generates control signal 106. Transistors P2 and N2 are configured as a transmission gate 112, transistors P4 and N4 are configured as a first inverter 114, and transistors P5 and N5 are configured as a second inverter 116, connected to receive the output signal 115 of first inverter 114, where the output of second inverter 116 is control signal 106. Transistors P1 and N1 and transmission gate 112 function as switches.

Bootstrap circuitry 110 receives a complementary pair of control signals ck and ckb, which control the operations of bootstrap circuitry 110 and thereby switch circuit 100. When control signal ck is low, control signal ckb is high, and vice versa. The control signals ck and ckb define two different phases of operation of control circuit 100: an OFF phase, in which ck is low and ckb is high, and an ON phase, in which ck is high and ckb is low.

Figure 2:
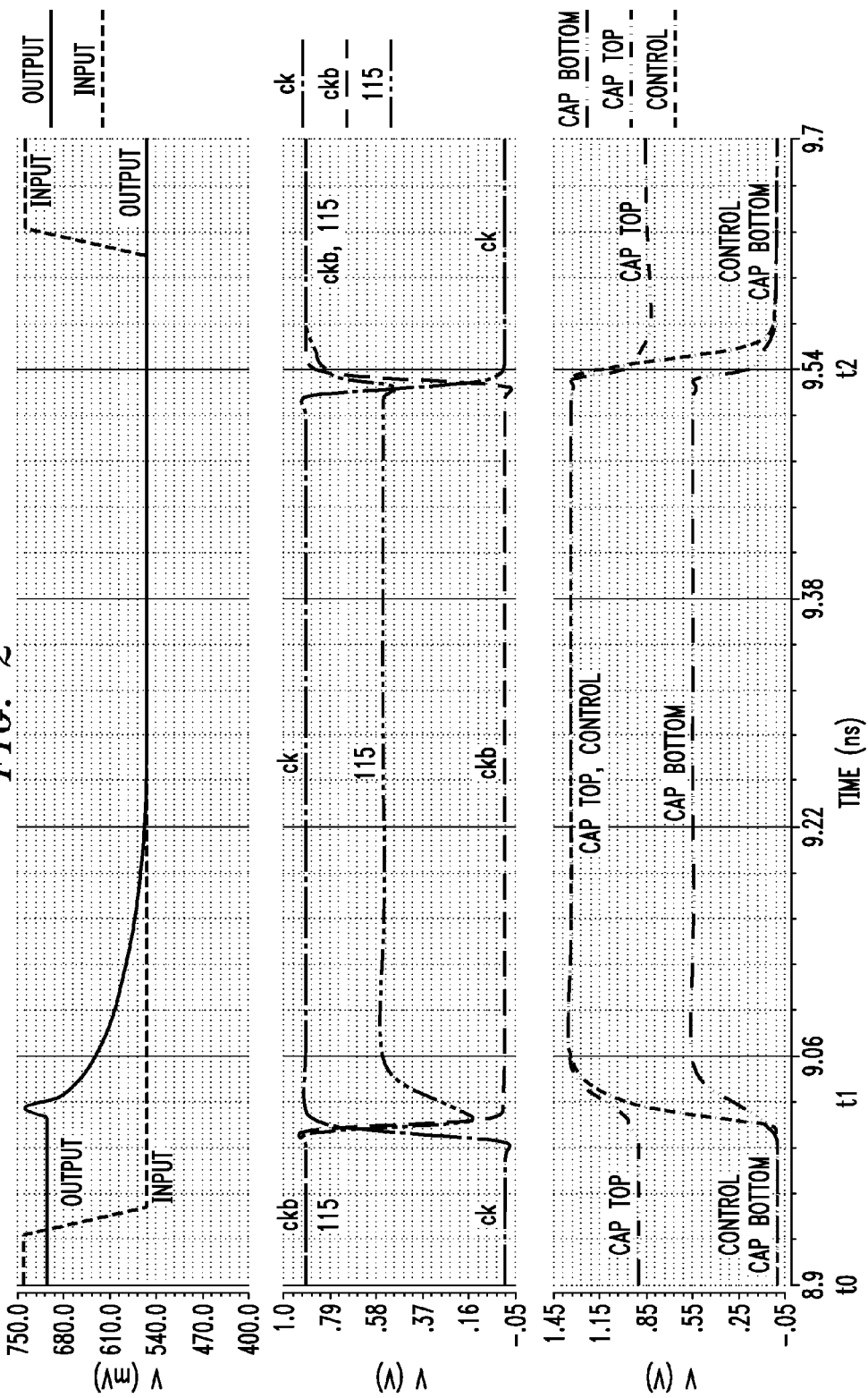
FIG. 2 shows a timing diagram of some of the signals in the bootstrap switch circuit of FIG. 1.

FIG. 2 shows a timing diagram of some of the signals in switch circuit 100 of FIG. 1. In FIG. 2, the time period between time t0 and time t1 corresponds to an instance of the OFF phase, in which control signal ck is low and control signal ckb is high. At time t1, ck goes high and ckb goes low, such that the time period between time t1 and time t2 corresponds to an instance of the ON phase. At time t2, ck goes low again and ckb goes high again, such that the time period following time t2 is a second instance of the OFF phase.

During the OFF phase, in which control signal ck is low and control signal ckb is high, transistor N1 is on, and transmission gate 112 is off (i.e., non-conducting). As such, the bottom plate of capacitor C1 (cap bottom in FIG. 2) is driven towards ground through transistor N1. In addition, output signal 115 of inverter 114 is high (as shown in FIG. 2), and the output of inverter 116 (i.e., control signal 106) is low (control in FIG. 2), which turns on transistor P1. As such, the top plate of capacitor C1 (cap top in FIG. 2) is driven towards the power supply voltage Vdd through transistor P1, resulting in a voltage difference of Vdd (about 0.9 volts in FIG. 2) being stored across the plates of capacitor C1. With control signal 106 low, switch transistor N3 is off, which prevents input signal 102 from being provided as output signal 104. This is shown in FIG. 2 by the signal output being different from and independent of the signal input between time t0 and time t1.

During the transition from the end of the OFF phase to the beginning of the ON phase, control signal ck changes from low to high, and control signal ckb changes from high to low. As a result, transistor N1 is turned off, thereby isolating the bottom plate of capacitor C1 from ground, and transmission gate 112 is turned on (i.e., conducting). In addition, output signal 115 of inverter 114 is driven lower (as shown in FIG. 2), and the output of inverter 116 (i.e., control signal 106) is driven high (control in FIG. 2), which turns off transistor P1 and isolates the top plate of capacitor C1 from Vdd, with the voltage difference of Vdd stored across the plates of capacitor C1. Thus, signal 115 tracks the capacitor C1 bottom plate voltage keeping N5 off and P5 on throughout the ON phase. Consequently, control signal 106 tracks capacitor C2 top plate voltage keeping P1 off and N3 on throughout the ON phase. Capacitor C1 is isolated from both power supplies with Vdd voltage stored across its plates.

With control signal 106 high, switch transistor N3 is turned on, which allows input signal 102 to be provided as output signal 104. This is shown in FIG. 2 by the signal output being the same as the signal input between time t1 and time t2.

Note that, in the ON phase, capacitor C1 bottom plate is driven to track input signal 102 through transmission gate 112, capacitor C1 top plate is Vdd voltage above input signal 102 by virtue of the Vdd voltage stored across the plates of capacitor C1, and control voltage 106 tracks the capacitor C1 top plate voltage. As a result, the gate-to-source voltage applied to switch transistor N3 is maintained at Vdd, regardless of the voltage of input signal 102 and even as the gate voltage applied to transistor N3 exceeds Vdd. As such, the speed and linearity performance of switch transistor N3 is optimized by applying a relatively high control voltage without subjecting transistor N3 to any over-voltage conditions, while using a relatively few number of devices (i.e., eight transistors and one capacitor) to implement the bootstrap circuitry.

Compared to the thirteen transistors and three capacitors required to implement the bootstrap circuitry of the Abo reference, the eight transistors and one capacitor of bootstrap circuitry 100 constitute a significant savings in area. Capacitors are typically much larger than transistors. Using one capacitor instead of three capacitors results in substantial area savings. In addition, using five fewer transistors also saves some area. Typically, there are several instantiations of the bootstrap switch in an electronic system. So, the area savings of circuit 100 are multiplied by the number of instances of it. Furthermore, to the extent that simpler, smaller solutions often perform better than more complex, larger solutions, bootstrap circuitry 100 may perform better, all things considered, than the bootstrap circuitry of the Abo reference.

In mixed-signal (i.e., digital/analog) technologies, it is often the case that a chip can be fabricated having two or more different kinds of MOS transistors having two or more different gate-oxide thicknesses. In a chip that supports two different kinds of MOS transistors having two different gate-oxide thicknesses, the two different kinds of transistors may be referred to as thin-oxide devices and thick-oxide devices respectively. In general, thin-oxide devices are capable of much faster speeds, but also have much higher drain-to-source off leakage currents than thick-oxide devices. Thin-oxide devices also have significant gate-to-source and gate-to-drain leakage currents, which can be a significant additional source of error when the switch is OFF.

The invention has been described in terms of the capacitor C1 being charged to a pre-charge voltage level that is equal to the voltage supply level, Vdd, during the OFF phase. It will be understood by those trained in the art that, during the OFF phase, capacitor C1 may instead be charged to a pre-charge voltage level which is lower than the supply voltage level, without departing from the scope of this invention.

Typically, there are at least two separate power supply voltages applied to a mixed-signal chip: Vddd for digital circuits and Vdda for analog circuits, where Vdda is typically twice as high as Vddd. Thick-oxide MOS devices have a tolerance for larger voltages (typically twice as large) across their terminals than thin-oxide MOS devices. Typically, thick-oxide devices can tolerate a maximum voltage equal to Vdda across any pair of their terminals, and thin-oxide devices can tolerate a maximum voltage equal to Vddd across any pair of their terminals.

In one implementation, bootstrap switch circuit 100 can be implemented with all thin-oxide devices and the Vddd power supply to provide a relatively fast bootstrap switch. In another implementation, bootstrap switch circuit 100 can be implemented with all thick-oxide devices and the Vdda power supply to provide a bootstrap switch having a relatively low off leakage current.

Figure 3:
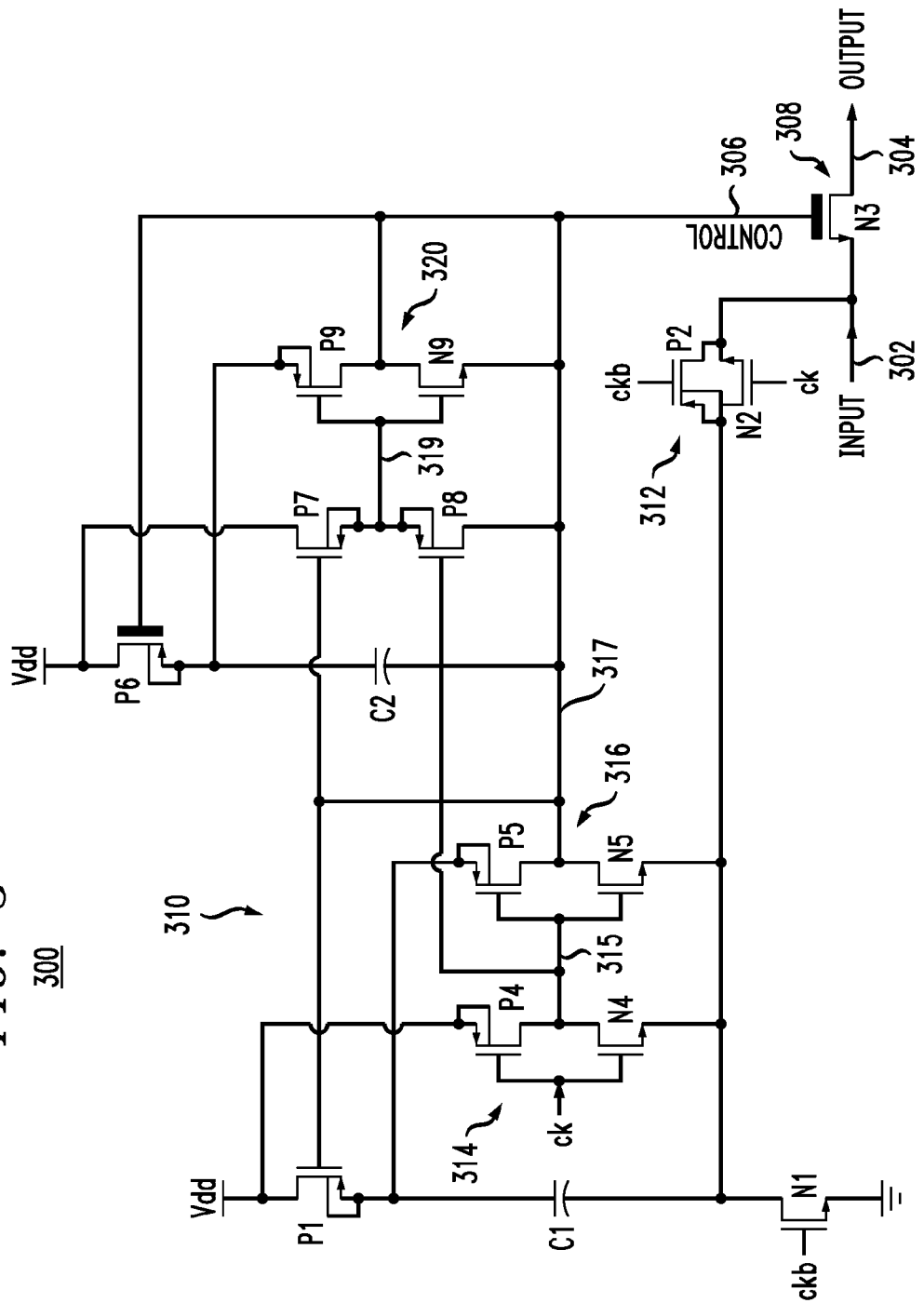
FIG. 3 shows a schematic circuit diagram of a bootstrap switch circuit according to another embodiment of the disclosure.

FIG. 3 shows a schematic circuit diagram of a bootstrap switch circuit 300 according to another embodiment of the disclosure. Like switch circuit 100 of FIG. 1, switch circuit 300 receives an input signal 302 and conditionally provides that input signal as an output signal 304 depending on the voltage of a control signal 306 applied to a switch 308 implemented using an n-type (e.g., nMOSFET) transistor N3. The input signal 302 may be any analog voltage between the Vdd and ground supply voltages.

In addition, switch circuit 300 comprises bootstrap circuitry 310 which (i) consists of p-type (e.g., pMOSFET) transistors P1, P2, P4-P9, n-type (e.g., nMOSFET) transistors N1, N2, N4, N5, and N9 and capacitors C1 and C2 and (ii) generates control signal 306. Transistors P2 and N2 are configured as a transmission gate 312; transistors P4 and N4 are configured as a first inverter 314; transistors P5 and N5 are configured as a second inverter 316, connected to receive the output signal 315 of first inverter 314, where the output of second inverter 316 is signal 317; and transistors P9 and N9 are configured as a third inverter 320. Transistors P1, P6-P8 and N1 and transmission gate 312 function as switches.

Bootstrap circuitry 310 receives a pair of complementary control signals ck and ckb, which control the operations of bootstrap circuitry 310 and thereby switch circuit 300. When control signal ck is low, control signal ckb is high, and vice versa. Control signals ck and ckb define two different phases of operation of control circuit 300: an OFF phase, in which ck is low and ckb is high, and an ON phase, in which ck is high and ckb is low.

FIG. 4 shows a timing diagram of some of the signals in switch circuit 300 of FIG. 3. As in FIG. 2, in FIG. 4, the time period between time t0 and time t1 corresponds to an instance of the OFF phase, in which control signal ck is low and control signal ckb is high. At time t1, ck goes high and ckb goes low, such that the time period between time t1 and time t2 corresponds to an instance of the ON phase. At time t2, ck goes low again and ckb goes high again, such that the time period following time t2 is a second instance of the OFF phase.

During the OFF phase, in which control signal ck is low and control signal ckb is high, transistor N1 is on and transmission gate 312 is off. As such, the bottom plate of capacitor C1 (cap1 bottom in FIG. 4) is driven towards ground through transistor N1. In addition, output signal 315 of inverter 314 is high (as shown in FIG. 4), and output signal 317 of inverter 316 is low (i.e., ground, through transistors N5 and N1), which turns on transistors P1 and P7. As such, the top plate of capacitor C1 (cap1 top in FIG. 4) is driven towards the power supply voltage Vdd through transistor P1, resulting in a voltage difference of Vdd (about 0.9 volts in FIG. 4) being stored across the plates of capacitor C1. In addition, the bottom plate of capacitor C2 (cap2 bottom in FIG. 4) is driven towards the ground level of signal 317. In addition, with signal 315 high, transistor P8 is off.

With transistor P7 on and transistor P8 off, signal 319 is driven high (i.e., towards Vdd, as shown in FIG. 4) through transistor P7. As a result, the output of inverter 320 (i.e., control signal 306) (control in FIG. 4) is driven low through N9, N5, and N1. With control signal 306 driven low, transistor P6 is turned on, which drives the top plate of capacitor C2 (cap2 top in FIG. 4) towards Vdd through transistor P6, resulting in a voltage difference of Vdd (about 0.9 volts in FIG. 4) being stored across the plates of capacitor C2. In addition, with control signal 306 low, switch transistor N3 is off, which prevents input signal 302 from being provided as output signal 304. This is shown in FIG. 4 by the signal output being different from and independent of the signal input between time t0 and time t1.

During the transition from the end of the OFF phase to the beginning of the ON phase, control signal ck changes from low to high, and control signal ckb changes from high to low. As a result, transistor N1 is turned off, thereby isolating the bottom plate of capacitor C1 from ground, and transmission gate 312 is turned on. In addition, output signal 315 of inverter 314 is driven lower (as shown in FIG. 4), which turns on transistor P8, and output signal 317 of inverter 316 is driven high, which turns off transistors P1 and P7 and isolates the top plate of capacitor C1 from Vdd, with the voltage difference of Vdd stored across the plates of capacitor C1. Thus, signal 315 tracks the capacitor C1 bottom plate voltage keeping N5 off and P5 on throughout the ON phase. Consequently, signal 317 tracks capacitor C1 top plate voltage keeping P1 and P7 off throughout the ON phase.

With transistor P7 off and transistor P8 on, signal 319 is driven towards the voltage level of signal 317 through transistor P8 (as shown in FIG. 4). Thus, signal 319 tracks the capacitor C2 bottom plate voltage keeping N9 off and P9 on throughout the ON phase. Consequently, signal 306 tracks capacitor C2 top plate voltage keeping P6 off and N3 on throughout the ON phase.

With transistor P6 turned off, the top plate of capacitor C2 is isolated from Vdd, with the voltage difference of Vdd stored across the plates of capacitor C2. In addition, with switch transistor N3 turned on, input signal 302 is provided as output signal 304. This is shown in FIG. 4 by the signal output being the same as the signal input between time t1 and time t2.

Note that, in the ON phase, capacitor C1 bottom plate tracks the input voltage (Vinput) 302 through the transmission gate 312. Capacitors C1 and C2, with Vdd voltage stored across the plates of each, are connected in series. The control voltage 306 tracks the capacitor C2 top plate voltage. Since both capacitor C1 and capacitor C2 are isolated from the supplies with a voltage difference of Vdd stored across the top and bottom plates of each, this drives the top plate of capacitor C2 (cap2 top in FIG. 4) to be 2*Vdd voltage above the bottom plate of capacitor C1 (cap1 bottom in FIG. 4). The control voltage 306 is driven to 2*Vdd voltage above the input voltage 302.

As a result, the gate-to-source voltage applied to switch transistor N3 is maintained at 2*Vdd, regardless of the voltage of the input signal 302 and even as the gate voltage applied to transistor N3 exceeds 2*Vdd. As such, the speed and linearity performance of switch transistor N3 are optimized by applying a relatively high control voltage without subjecting transistor N3 to any over-voltage conditions, while using a relatively few number of devices (i.e., thirteen transistors and two capacitors) to implement the bootstrap circuitry.

Note that, in the implementation shown in FIG. 3, transistors N3 and P6 are thick-oxide devices, while the rest of the transistors are thin-oxide devices which have half the voltage tolerance of the thick-oxide devices. Also note that bootstrap switch circuit 300 uses only the lower digital power supply Vddd. The use of a thick-oxide transistor for switch device N3 provides a substantial performance improvement, because the drain-to-source, drain-to-gate, and drain-to-substrate leakage currents through this device when the device is off are significantly smaller than they would be for a thin-oxide device, and consequently, the total leakage from the output node during the OFF phase is significantly reduced. This low OFF leakage current is critical in many applications, such as a sample & hold circuit, where the duration of time for which the stored charge can be held on the sampling capacitor, which is connected to the output node, between recharges is determined by the leakage performance of the switch.

The use of almost all thin-oxide devices in the bootstrap circuitry 310 enables substantially higher speed performance relative to a bootstrap circuitry comprised of all thick-oxide devices. Note that input signals ck and ckb in bootstrap circuitry 310, when they are in their 'high' state, have voltage equal to the voltage of the digital power supply, Vddd. Consequently, ck and ckb signals can be generated directly by circuits that use only the Vddd digital power supply, allowing the generating circuitry to also be comprised of only thin-oxide devices and to also be high speed in performance.

Note that, in switch circuit 300, the voltage level of control signal 306 is (2*Vddd)+Vinput, when switch device N3 is ON. Consequently, the gate-to-source voltage of device N3 is (2*Vddd), which is the maximum voltage that device N3 can tolerate, throughout the ON phase. As such, bootstrap circuitry 310 generates the highest possible ON voltage for device N3 without exposing it to degradation due to over-voltage. As a result, bootstrap circuitry 310 maximizes the high-speed performance of the bootstrap switch circuit 300.

In general, in switch circuit 300, all thin-oxide devices have less than or equal to Vddd voltage across any pair of their terminals, while all thick-oxide devices have less than or equal to 2*Vddd voltage across any pair of their terminals. As such, switch circuit 300 prevents over-voltage degradation of all thin and thick oxide devices that it is comprised of.

By combining the advantages of a high-speed bootstrap circuitry, high control voltage 306, and low output node OFF leakage, all in the same implementation, switch circuit 300 constitutes a substantial performance improvement over the Abo reference, while still using one fewer capacitor.

Although FIGS. 1 and 3 do not show the control circuitry used to generate the pair of complementary control signals ck and ckb, those skilled in the art will understand that those control signals may be generated using any suitable analog, digital, or a hybrid of both analog and digital circuit-based processes.

The invention has been described in terms of the capacitors C1 and C2 being charged to pre-charge voltage levels that are equal to the voltage supply level, Vdd, during the OFF phase. It will be understood by those trained in the art that, during the OFF phase, either one or both of capacitors C1 and C2 may instead be charged to pre-charge voltage levels which are lower than the supply voltage level, without departing from the scope of this invention.

It will be understood by those trained in the art that, depending on the input voltage range of a particular application, it may be appropriate to replace transmission gate 112 of FIG. 1 and similarly transmission gate 312 of FIG. 3 with either a PMOS device or an NMOS device, without departing from the scope of this invention. It will also be understood that, depending on the transistor characteristics of a particular technology and/or the input voltage range of a particular application, it may be appropriate to replace NMOS N4 in FIG. 1 and similarly NMOS N4 in FIG. 3 with transmission gates, without departing from the scope of this invention. In general, any transistor device in FIG. 1 and FIG. 3 may be replaced by one of many other possible embodiments of a switch, without departing from the scope of this invention.

In general, bootstrap switch circuits of the disclosure may be implemented as circuit-based processes, including possible implementation in a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, micro-controller, general-purpose computer, or other processor.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all input digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant input digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel or in series to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the invention is implemented using bi-polar transistor technology.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts (e.g., if appropriate, circuits, sub-circuits, and components) which have been described and illustrated in order to explain embodiments of the invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. Apparatus having a bootstrap switch circuit comprising:
   a switch device connected between an input node and an output node;
   a first capacitor connected between the input node and a gate of the switch device; and
   bootstrap circuitry selectively interconnecting a first plate of the first capacitor to the gate of the switch device and a second plate of the first capacitor to the input node, wherein:
   during a first phase, the bootstrap circuitry is configured to (i) turn off the switch device and (ii) charge the first capacitor to a pre-charge voltage level which is no higher than a supply voltage level;
   during a second phase, the bootstrap circuitry is configured to (i) cease charging the first capacitor and (ii) connect the first capacitor between the input node and the gate of the switch device, such that a voltage difference between the gate and a channel node of the switch device is maintained at or below a voltage tolerance level for the switch device; and
   the bootstrap circuitry comprises:
      a first switch connected between a first supply voltage node and the first plate of the first capacitor, wherein a gate of the first switch is connected to the gate of the switch device;
      a second switch connected between the second plate of the first capacitor and a second supply voltage node;
      a third switch connected between the second plate of the first capacitor and the input node;
      a first inverter connected between the first supply voltage node and the second plate of the first capacitor; and
      a second inverter connected to an output signal of the first inverter and connected between the first and second plates of the first capacitor, wherein an output signal of the second inverter is connected to the gate of the switch device.

2. The invention of claim 1, wherein the bootstrap switch circuit has no more than two capacitors.

3. The invention of claim 1, wherein:
   during the first phase, (i) the second switch is closed, (ii) the third switch is open, (iii) the output signal of the first inverter is high, (iv) the output signal of the second inverter is low, and (v) the first switch is closed; and
   during the second phase, (i) the second switch is open, (ii) the third switch is closed, (iii) the output signal of the first inverter is low, (iv) the output signal of the second inverter is high, and (v) the first switch is open.

4. The invention of claim 1, wherein the output signal of the second inverter is connected directly to the gate of the switch device.

5. The invention of claim 1, wherein the voltage difference between the gate and the channel node of the switch device is maintained at or below the supply voltage level.

6. The invention of claim 1, wherein the bootstrap circuitry further comprises:
   a fourth switch and a second capacitor connected in series between the first supply voltage node and the output signal of the second inverter;
   a fifth switch and a sixth switch connected in series between the first supply voltage node and the output signal of the second inverter; and
   a third inverter connected between the two plates of the second capacitor and having an output signal connected to the gate of the switch device.

7. The invention of claim 6, wherein the fourth switch is a thick-oxide device and the rest of the devices in the bootstrap circuitry are thin-oxide devices.

8. The invention of claim 6, wherein:
   during the first phase, (i) the second switch is closed, (ii) the third switch is open, (iii) the output signal of the first inverter is high, (iv) the output signal of the second inverter is low, (v) the first switch is closed, (vi) the fourth switch is closed, (v) the fifth switch is closed, (vi) the sixth switch is open, and (vii) the output signal of the third inverter is low; and
   during the second phase, (i) the second switch is open, (ii) the third switch is closed, (iii) the output signal of the first inverter is low, (iv) the output signal of the second inverter is high, (v) the first switch is open, (vi) the fourth switch is open, (v) the fifth switch is open, (vi) the sixth switch is closed, and (vii) the output signal of the third inverter is high.

9. The invention of claim 6, wherein the voltage difference between the gate and the channel node of the switch device is maintained at or below two times the supply voltage level.

10. The invention of claim 1, wherein the bootstrap switch circuit has no more than one capacitor.

11. The invention of claim 10, wherein the bootstrap circuitry has no more than 7 switches.

12. The invention of claim 1, wherein the apparatus is an integrated circuit.

13. The invention of claim 1, wherein the supply voltage level is no higher than the voltage tolerance level of the switch device and any devices used to implement the bootstrap circuitry.

14. The invention of claim 1, wherein:
   the switch device is a thick-oxide switch device; and
   the bootstrap circuitry comprises one or more thin-oxide devices having gate oxide thinner than gate oxide of the thick-oxide switch device.

15. Apparatus having a bootstrap switch circuit comprising:
   a thick-oxide switch device connected between an input node and an output node;
   a first capacitor connected between the input node and a gate of the switch device; and
   bootstrap circuitry selectively interconnecting a first plate of the first capacitor to the gate of the switch device and a second plate of the first capacitor to the input node, wherein:
   during a first phase, the bootstrap circuitry is configured to (i) turn off the switch device and (ii) charge the first capacitor to a pre-charge voltage level which is no higher than a supply voltage level;
   during a second phase, the bootstrap circuitry is configured to (i) cease charging the first capacitor and (ii) connect the first capacitor between the input node and the gate of the switch device, such that a voltage difference between the gate and a channel node of the switch device is maintained at or below a voltage tolerance level for the switch device; and the bootstrap circuitry comprises one or more thin-oxide devices having gate oxide thinner than gate oxide of the thick-oxide switch device, wherein the bootstrap circuitry comprises:
- a first switch connected between a first supply voltage node and the first plate of the first capacitor, wherein a gate of the first switch is connected to the gate of the switch device;
- a second switch connected between the second plate of the first capacitor and a second supply voltage node;
- a third switch connected between the second plate of the first capacitor and the input node;
- a first inverter connected between the first supply voltage node and the second plate of the first capacitor;
- a second inverter connected to an output signal of the first inverter and connected between the first and second plates of the first capacitor, wherein an output signal of the second inverter is connected to the gate of the switch device;
- a fourth switch and a second capacitor connected in series between the first supply voltage node and the output signal of the second inverter;
- a fifth switch and a sixth switch connected in series between the first supply voltage node and the output signal of the second inverter; and
- a third inverter connected between the two plates of the second capacitor and having an output signal connected to the gate of the switch device.

16. The invention of claim 15, wherein the supply voltage level is no higher than a voltage tolerance level for the thin-oxide devices.

17. The invention of claim 15, wherein the pre-charge voltage level is at most one-half of the voltage tolerance level for the thick-oxide switch device.

18. The invention of claim 15, wherein the voltage difference between the gate and the channel node of the switch device is maintained at or below two times the supply voltage level.

19. The invention of claim 15, wherein:
- during the first phase, (i) the second switch is closed, (ii) the third switch is open, (iii) the output signal of the first inverter is high, (iv) the output signal of the second inverter is low, (v) the first switch is closed, (vi) the fourth switch is closed, (v) the fifth switch is closed, (vi) the sixth switch is open, and (vii) the output signal of the third inverter is low; and
- during the second phase, (i) the second switch is open, (ii) the third switch is closed, (iii) the output signal of the first inverter is low, (iv) the output signal of the second inverter is high, (v) the first switch is open, (vi) the fourth switch is open, (v) the fifth switch is open, (vi) the sixth switch is closed, and (vii) the output signal of the third inverter is high.

20. The invention of claim 15, wherein the fourth switch is a thick-oxide device and the rest of the devices in the bootstrap circuitry are thin-oxide devices.

21. The invention of claim 15, wherein the bootstrap switch circuit has no more than two capacitors.

22. The invention of claim 15, wherein the apparatus is an integrated circuit.

* * * * *